(12) United States Patent
Ueda et al.

(10) Patent No.: US 6,620,862 B2
(45) Date of Patent: Sep. 16, 2003

(54) SHEET RESIN COMPOSITION AND PROCESS FOR MANUFACTURING SEMICONDUCTOR DEVICE THEREWITH

(75) Inventors: Hirotaka Ueda, Yokohamashi (JP); Masaki Mizutani, Osaka (JP)

(73) Assignees: Amkor Technology, Inc., Chandler, AZ (US); Nitto Denko Corporation, Osaka (JP)

( * ) Notice: Subject to any disclaimer, the term of this patent is extended or adjusted under 35 U.S.C. 154(b) by 0 days.

(21) Appl. No.: 09/851,564

(22) Filed: May 8, 2001

(65) Prior Publication Data

US 2002/0001688 A1 Jan. 3, 2002

(30) Foreign Application Priority Data

May 23, 2000 (JP) ........................................ 2000-151364

(51) Int. Cl.[7] ............................................. C08L 63/00
(52) U.S. Cl. ................. 523/443; 523/440; 523/463; 523/464; 523/465; 523/466; 525/523; 525/529; 528/86; 528/87; 528/88; 528/89; 528/93; 528/94; 528/104; 528/106
(58) Field of Search .................. 523/401, 440, 523/443, 463, 464, 465, 466, 467; 528/86, 87, 88, 89, 93, 94, 104, 106; 525/523, 529

(56) References Cited

U.S. PATENT DOCUMENTS

| | | | | |
|---|---|---|---|---|
| 5,232,970 A | * | 8/1993 | Solc et al. .................. 524/404 |
| 5,756,564 A | * | 5/1998 | Murata et al. ............... 523/466 |
| 5,935,314 A | * | 8/1999 | Higuchi et al. ............. 106/400 |
| 5,940,688 A | * | 8/1999 | Higuchi et al. ............. 438/127 |
| 6,001,901 A | * | 12/1999 | Shiobara et al. ............ 438/127 |
| 6,083,774 A | * | 7/2000 | Shiobara et al. ............ 156/382 |
| 6,084,037 A | * | 7/2000 | Shimizu et al. ............. 523/443 |
| 6,200,830 B1 | * | 3/2001 | Ito et al. ..................... 438/106 |
| 6,207,296 B1 | * | 3/2001 | Higuchi et al. ............. 428/620 |
| 6,231,997 B1 | * | 5/2001 | Arai et al. .................. 428/620 |
| 6,319,619 B1 | * | 11/2001 | Yamamoto et al. ......... 428/620 |
| 6,333,206 B1 | * | 12/2001 | Ito et al. ..................... 438/106 |
| 6,342,309 B1 | * | 1/2002 | Shiobara et al. ............ 428/413 |
| 6,376,923 B1 | * | 4/2002 | Sumita et al. ............... 257/778 |

FOREIGN PATENT DOCUMENTS

WO    WO98/28788    2/1998

\* cited by examiner

*Primary Examiner*—Robert Dawson
*Assistant Examiner*—Michael J Feely
(74) *Attorney, Agent, or Firm*—Gunnison, McKay & Hodgson, L.L.P.; Serge J. Hodgson

(57) ABSTRACT

A sheet resin composition is adhered to a silicon wafer. The sheet resin composition supports the silicon wafer during back grinding and dicing into chips. Further, the sheet resin composition interfacial underfills between a chip from the wafer and a substrate during subsequent fabrication of a semiconductor device, the chip being flip chip mounted to the substrate.

34 Claims, 1 Drawing Sheet

SHEET RESIN COMPOSITION AND PROCESS FOR MANUFACTURING SEMICONDUCTOR DEVICE THEREWITH

BACKGROUND OF THE INVENTION

1. Field of the Invention

The present invention relates to a sheet resin composition for back-grinding or underfilling of a silicon wafer, a process for manufacturing a semiconductor device, and a semiconductor device.

2. Discussion of the Related Art

With the recent increasing trends for high-density semiconductor devices, a package system employing integrated circuit (IC) comprising bumps, which is so-called "flip chip," has been rapidly widely used. In addition, owing to the requirement of manufacturing a thinner semiconductor device, in order to make a semiconductor wafer thinner, the wafer is subjected to so-called "back-grinding," wherein the back side of the wafer is ground. Particularly, in these several years, with the spread of a semiconductor device so-called "chip scale package (CSP)," a technique of making a wafer comprising bumps even thinner has been demanded in the market. When such a thin wafer comprising bumps is obtained, there has been employed a process comprising subjecting a wafer to back-grinding to a desired thickness, and thereafter attaching bumps. However, a thin wafer obtained after back-grinding is difficult to transport. Moreover, from the aspect of the recent progressing trend for enlarging a diameter of a wafer, there has been strongly demanded in the market the development of a technique for carrying out a back-grinding process after attaching bumps.

As a means for solving the above problems, there has been known a process in which an adhesive tape for back-grinding is adhered to the active surface (the opposite surface of the surface subjected to back-grinding) of a wafer on which bumps exist, and then the wafer is subjected to back-grinding. However, it is difficult to sufficiently fill the ruggedness of the wafer surface due to the bumps with the adhesive tape for back-grinding. Therefore, there arise problems that water penetrates to the active surface of the wafer during back-grinding, that the ruggedness caused by the bumps on the ground surface of the wafer remains after back-grinding, and the like. Therefore, wafers cannot be efficiently obtained, and the resulting wafer does not sufficiently meet the requirement of the market. Further, the adhesive tape for back-grinding must be completely removed from the wafer surface after back-grinding.

On the other hand, when a chip with bumps obtained by cutting the wafer subjected to back-grinding by means of dicing is attached on a substrate, a liquid thermosetting resin so-called "underfilling material" is filled between the chip and the substrate, and the thermosetting resin is cured (underfilling step). The underfilling step is an indispensable technique for securing the reliability for electric connection between the chips and the substrate. However, the number of its treatment steps is large, wherein the process comprises the steps of applying flux on a substrate; attaching a chip on the substrate; cleaning out the flux; filling an underfilling material between the chip and the substrate; and curing the underfilling material. Therefore, an even simpler process has been demanded in the market.

SUMMARY OF THE INVENTION

In accordance with the present invention, a sheet resin composition capable of excellently supporting a silicon wafer during back-grinding, and having an underfilling function during packaging a chip on a substrate is presented. Also in accordance with the present invention, a process for manufacturing a semiconductor device using the sheet resin composition, and the resulting semiconductor device, are presented.

More particularly, as a result of intensive studies in order to solve the problems associated with the prior art, the present inventors have found that by using a sheet resin composition having both of the function of supporting a wafer during back-grinding and the function of underfilling during packaging of a chip to a substrate, the back-grinding of the wafer is excellently performed, and the step during packaging of a chip to the substrate is simplified.

In sum, presented in accordance with various embodiments of the present invention are:

(1) a sheet resin composition comprising a resin composition capable of adhering to a silicon wafer, usable for supporting a silicon wafer during back-grinding and interfacial underfilling between a chip and a substrate;

(2) a process for manufacturing a semiconductor device, comprising adhering onto a silicon wafer a sheet resin composition to support the silicon wafer, subjecting the silicon wafer to back-grinding, and underfilling an interface between a chip and a substrate with the sheet resin composition as an underfilling material; and (3) a semiconductor device obtained by the process as defined in item (2).

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION OF THE INVENTION

Figure 1:
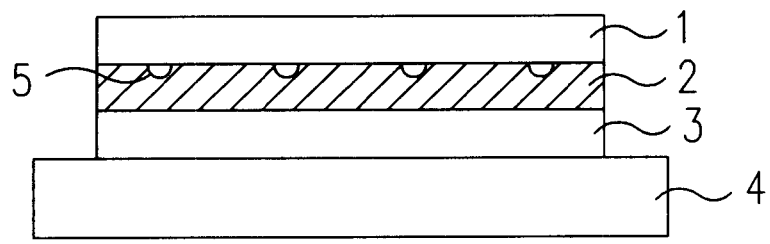
FIG. 1 is a schematic view showing a silicon wafer fixed to a grinding stage, wherein a sheet resin composition, one side of which is protected by a releasing plastic film, is adhered to the silicon wafer in accordance with one embodiment of the present invention.

The sheet resin composition in accordance with the present invention is capable of adhering to a silicon wafer, including, for instance, thermosetting resin compositions, thermoplastic resin compositions, and the like. Among these resin compositions, from the viewpoints of low melt viscosity and high heat resistance, the thermosetting resin compositions are well-suited for use. The thermosetting resin composition includes epoxy resin compositions, phenolic resin compositions, diallylphthalate resin compositions, benzocyclobutene resin compositions, and the like, among which the epoxy resin compositions are well-suited for use, from the viewpoints of low melt viscosity and high heat resistance.

The epoxy resin contained in the epoxy resin composition is not particularly limited, and examples thereof include a cresol novolak epoxy resin, a biphenyl epoxy resin, a bisphenol A epoxy resin, a bisphenol F epoxy resin, and the like. In addition, an epoxy resin having excellent wettability during melting and low viscosity is well-suited for use. In particular, from the viewpoint of improving wettability, there are cited epoxy resins having the structures represented by the formulas (1) to (3). These epoxy resins may be used alone or in admixture of two or more kinds.

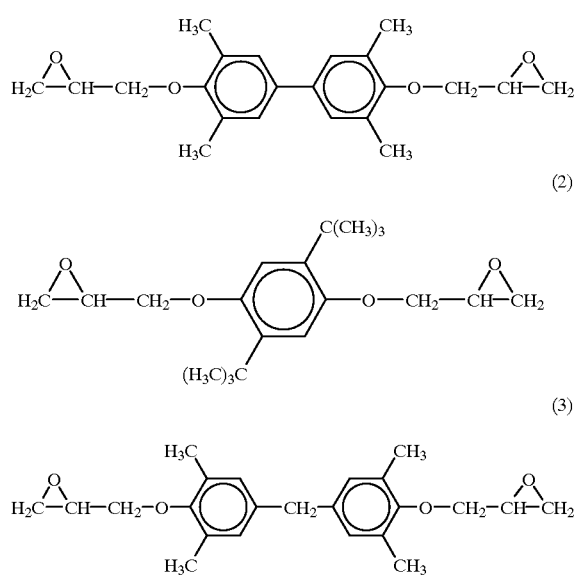

The epoxy resin having the structures represented by the formulas (1) to (3) have an epoxy equivalence of from 150 to 230 g/eq, and a melting point of from 50° to 160° C. in one embodiment. In another embodiment, in order to improve the wettability of the resin components, there is partly used a liquid epoxy resin.

In one embodiment, the resin composition comprises a curing agent.

The curing agent is not particularly limited, as long as it is one usually usable as a curing agent of an epoxy resin. An example of the curing agent includes, for instance, phenolic resins and acid anhydride curing agents such as methyl-hexahydrophthalic acid anhydride. In particular, there is suitably used the phenolic resins such as phenol aralkyl resins and phenol novolak resins, with particular suitability given to those phenolic resins having low viscosity. Among them, the phenolic resin having a hydroxyl group equivalence of from 80 to 200 g/eq and a softening point of 85° C. or less is suitable, and the phenolic resin having a hydroxyl group equivalence of from 90 to 190 g/eq and a softening point of from 50° to 80° C. is more suitable, and particularly, the phenolic resin having a hydroxyl group equivalence of from 100 to 180 g/eq and a softening point of from 55° to 75° C. is still more suitable.

The content of the curing agent may be an amount which is sufficient to cure the epoxy resin. For instance, when the phenolic resin is used as the curing agent, its content is such that the hydroxyl group equivalence in the phenolic resin per one epoxy group equivalence in the epoxy resin is adjusted to be generally from 0.5 to 1.6, and more suitably from 0.8 to 1.2.

The sheet resin composition may optionally comprise an inorganic filler.

As the inorganic filler, various inorganic fillers which are usually usable can be used without limitation. The inorganic filler includes, for instance, silica powder, alumina, silicon nitride, manganese oxide, calcium carbonate, titanium white, and the like. Among them, spherical silica powder and disintegrated silica powder are suitably used, and spherical silica is particularly well-suited for use. The inorganic filler may be used alone, or it may be constituted by various kinds of materials.

As the inorganic filler, those having a small particle size and a given particle size distribution are suitably used. Concretely, from the viewpoints of preventing initial failure in the electric conductivity owing to the fact that the filler is caught between a semiconductor element and electrodes of a wiring circuit substrate and imparting stability in the electric conductivity after bonding, the maximal particle size of the inorganic filler is generally 20 $\mu$m or less, more suitably from 1 to 12 $\mu$m, still more suitably from 1 to 5 $\mu$m. In addition, from the viewpoint of imparting the stability in the electric conductivity after bonding, i.e. maintaining high reliability after cooling-heating cycle, or from the viewpoint of lowering an amount of voids generated, the median size of the inorganic filler is generally from 0.2 to 3 $\mu$m, more suitably from 0.2 to 2 $\mu$m, still more suitably from 0.2 to 0.9 $\mu$m. Further, those having a particle size of 5 $\mu$m or less make up 70% by volume or more, more suitably 80% by volume or more, still more suitably 100% by volume, of an entire inorganic filler. In other words, in accordance with one embodiment of the present invention, the proportion of the particles having a relatively large particle size exceeding 5 $\mu$m is as little as possible. When the proportion of the particles having a relatively large particle size exceeding 5 $\mu$m is large and exceeds 30% by volume of the inorganic filler, the stability in the electric conductivity after cooling-heating cycle is lowered, thereby making it undesirably difficult to maintain high reliability. Therefore, by the use of an inorganic filler having the particle size distribution as defined in accordance with the present invention, there are exhibited excellent effects that no initial failure in the electric conductivity is caused, and that stable electric conductivity is obtained and no generation of voids take place, even after applying to the resin composition a severe stress such as cooling-heating cycle test.

In accordance with the present invention, the particle size distribution of the inorganic filler can be adjusted by appropriately using a conventionally known classification method.

The maximal particle size, the median size and the particle size distribution of the inorganic filler as mentioned above is determined in one embodiment by scattering-type particle size distribution analyzer "LA-910" manufactured by HORIBA, Ltd. In addition, the inorganic filler having the maximal particle size, the median size and the particle size distribution defined in the ranges mentioned above are those of commercially available products in one embodiment.

The content of the inorganic filler is generally from 0 to 90% by weight, more suitably from 0 to 85% by weight, still more suitably from 0 to 80% by weight, of the sheet resin composition. In addition, from the viewpoint of preventing an increase in the melt viscosity of the underfilling resin, which leads to a poor packing ability, the content of the inorganic filler is generally 90% by weight or less.

Besides each of the components mentioned above, the sheet resin composition may optionally comprise various additives. There may be used in appropriate amounts, for instance, silicone compounds such as side chain ethylene glycol dimethyl siloxane; stress-lowering agents such as acrylonitrile-butadiene copolymers; waxes such as polyethylenes and carnauba; and coupling agents including silane coupling agents such as γ-glycidoxypropyl trimethoxysilane. It is especially suitable to add the stress-lowering agents because there are exhibited effects that the flowability of the resin component mixture during thermal curing is suppressed and that the sheet resin composition is provided with tacking ability when the sheet resin composition is processed into a sheet.

As the acrylonitrile-butadiene copolymer (NBR), it includes not only the case where the content of the NBR is 100% by weight, but also the case where other copolymer components are contained in the NBR. Other copolymer components include, for instance, hydrogenated acrylonitrile-butadiene rubber, acrylic acid, acrylic ester, styrene, methacrylic acid, and the like. Among them, acrylic acid and methacrylic acid, which have excellent adhesion to metals and plastics, are particularly suitable. Specifically, acrylonitrile-butadiene-methacrylic acid copolymers and acrylonitrile-butadiene-acrylic acid copolymers are used. In addition, the content of acrylonitrile in the NBR is generally from 10 to 50% by weight, more suitably from 15 to 40% by weight.

In addition, besides the additives mentioned above, halogen-based flame retardants such as novolak brominated epoxy resins; and flame retardant aids such as antimony trioxide are used in one embodiment.

Further, as a flame retardant other than the halogen-based flame retardants mentioned above, in one embodiment, there are used composite metal hydroxide having a polyhedral shape represented by the general formula:

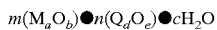

wherein M and Q are metal elements different from each other, where M is selected from the group consisting of Al, Mg, Ca, Ni, Co, Sn, Zn, Cu, Fe, Ti and B, and Q is a metal element belonging to the Group selected from Groups IVa, Va, VIa, VIIa, VIII, Ib and IIb in the Periodic Table; and each of m, n, a, b, c, d and e is a positive number, which may be identical to or different from each other.

This composite metal hydroxide has the crystalline structure of a polyhedral form. It does not have a conventional hexahedral form, or a platy form having thin thickness such as scaly form for the crystalline structure. Rather, it refers to a composite metal hydroxide having large crystal growth in the direction of thickness as well as in the length and width directions, including, for instance, those having a granular crystalline form which are made to resemble steric and spherical form by the crystal growth of a laminar crystal in the direction of thickness, the granular crystalline forms including, approximate dodecahedron, approximate octahedron, approximate tetrahedron, and the like.

With respect to the composite metal hydroxide represented by the general formula, M, showing a metal element, includes Al, Mg, Ca, Ni, Co, Sn, Zn, Cu, Fe, Ti, B, and the like.

In addition, Q, showing another metal element in the general formula, is a metal element belonging to the Group selected from Groups IVa, Va, VIa, VIIa, VIII, Ib and IIb in the Periodic Table. Q includes, for instance, Fe, Co, Ni, Pd, Cu, Zn, and the like, which may be selected alone or in admixture of two or more kinds.

For instance, the composite metal hydroxide having large crystal growth in the direction of thickness as well as in the length and width directions, and a desired polyhedral crystalline form, are obtained by controlling various conditions in the manufacturing process of the composite metal hydroxide, and are usually a mixture of various shapes in one embodiment.

Concrete representative examples of the composite metal hydroxide include a hydrate of magnesium oxide and nickel oxide, a hydrate of magnesium oxide and zinc oxide, a hydrate of magnesium oxide and copper oxide, and the like.

In addition, the composite metal hydroxide having a polyhedral form has an aspect ratio of generally from 1 to 8, suitably from 1 to 7, more suitably from 1 to 4. The aspect ratio referred to herein is expressed by a ratio of length to width of the composite metal hydroxide. In other words, in a case where the aspect ratio exceeds 8, the effect on a decrease in viscosity becomes poor when an epoxy resin composition comprising the composite metal hydroxide is melted.

The sheet resin composition in accordance with one embodiment of the present invention is prepared as described below by taking an epoxy resin composition as an example. Specifically, an epoxy resin and a curing agent as resin components are mixed and melted under heating, and the resulting resin mix in a molten state is mixed with an inorganic filler, and other additives optionally added to form an inorganic filler containing resin mix. As a mixing method, there may be employed a pot, a double-screw roller, a triple-screw roller, and the like. Thereafter, a catalyst for adjusting the reactivity is added to the inorganic filler containing resin mix to give a homogeneous reaction mixture, sometimes called a resin composition, and the mixture is processed into a desired shape such as sheet or tape, to give a sheet resin composition. In a case of a form of the tape, in one embodiment, it is applied to mass production system by so-called "reel-to-reel."

The catalyst usable herein includes various catalysts which have been conventionally used as curing accelerators, including, for instance, triphenylphosphine, 2-methylimidazole, DBU (1,8-diazabicyclo(5.4.0) undecene-7), DBN (1,5-diazabicyclo(4.3.0)nonene-5), 4P4B (tetraphenylphosphonium tetraphenyl borate), and the like. In the present invention, it is especially suitable when cresol novolak epoxy resin as an epoxy resin is used in combination with a phenol aralkyl resin as a curing agent, and further an amine catalyst is used, from the viewpoint of imparting excellent adhesion to polyimide-coated chips prepared by coating the chips with a passivation membrane made of a polyimide, and the like.

In order to process the resin composition into a sheet, for instance, a sheet resin composition is obtained by placing a homogeneous mixture on a palette, cooling the mixture, and thereafter pressing with a press or roller. Alternatively, the sheet resin composition is obtained by applying a mixture prepared by mixing the above homogeneous mixture with a solvent.

In addition, the solvent includes methyl ethyl ketone, acetone, ethyl acetate, toluene, and the like. Also, the coating devices include comma coater, fountain coater, bar coater, engravure coater, and the like.

As the physical properties of the sheet resin composition, the melt viscosity at 150° to 200° C. is generally from 0.01 to 1000 Pa●s, more suitably from 0.01 to 500 Pa●s, and the gelation time at 150° C. is generally from 0.1 to 10 minutes, more suitably from 0.1 to 5 minutes. In addition, the coefficient of linear expansion for the cured product is generally from 7 to 80 ppm, more suitably from 10 to 70 ppm. By setting the melt viscosity within the above range, the packing ability becomes excellent. By setting the gelation time within the above range, the mold workability, particularly curing time, is shortened in one embodiment. By setting the coefficient of linear expansion within the above range, in one embodiment, there is prevented the generation of defects caused by stress, such as cracks in the cured products or in the semiconductor elements. Incidentally, the melt viscosity is measured by flow tester viscometer, and the gelation time is measured on a hot plate. In addition, the coefficient of linear expansion is determined by thermomechanical analysis (TMA).

In addition, when the sheet resin composition is pasted together with a wafer with bumps, since it is necessary that the sheet resin composition closely contacts the surface of a wafer along the ruggedness of the bumps to an extent that penetration of water is prevented during back-grinding, those plastically deformable at a pasting temperature are particularly well-suited. The suitable viscosity of the resin composition at a pasting temperature of from 20° to 150° C. is from 10 to $10^{10}$ Pa·s, more suitably from 100 to $10^9$ Pa·s.

In addition, the thickness of the sheet resin composition is generally from 5 to 250 μm, more suitably from 10 to 120 μm. Particularly when the silicon wafer, to which the sheet resin composition is adhered, has bumps, it is suitable that the sheet thickness is a sum of an average height of bumps plus 0 to 50 μm, and that the variation of the thickness from its average value is within±5 μm. Incidentally, the thickness of the sheet resin composition as referred herein is a thickness when the surface of the silicon wafer on which no bumps are formed is considered as the standard surface.

It is suitable to protect the surface of the sheet resin composition with a releasing plastic film to prevent dusts and the like from depositing on the surface of the sheet resin composition until use, since the sheet resin composition has adhesion to the silicon wafer at 20° to 150° C., and to reinforce the sheet resin composition of which film strength is deficient in a single layer, making its transport difficult.

The releasing plastic film includes those prepared by subjecting a plastic film such as a polyethylene terephthalate film, a polyester film, a polyvinyl chloride film, a polycarbonate film, or a polyimide film to releasing treatment with a known releasing agent such as a silicone, long-chained alkyl, fluorine, aliphatic amide, or silica releasing agent. In addition, it may be a fluorocarbon resin film such as a polytetrafluoroethylene film, a polypropylene film or a polyethylene film.

Alternatively, it is also possible to prepare a releasing film appropriate for the present application by providing a thermally blowable adhesive layer, an ultraviolet ray curable adhesive layer, or the like on an interface between the plastic film and the sheet resin composition, thereby imparting differences in the releasing strengths between the sheet resin composition and the thermally blowable adhesive layer or the ultraviolet ray curable adhesive layer before and after heating or subjecting to ultraviolet ray irradiation.

The thickness of the releasing plastic film is not particularly limited, and for instance, the thickness is generally from 10 to 200 μm, more suitably from 20 to 150 μm.

A process for manufacturing a sheet resin composition of which surface is protected with a releasing plastic film is not particularly limited, and such a sheet resin composition can be obtained by inserting a sheet resin composition between the releasing plastic films, and pressing the laminate by a press roller or a roller.

The sheet resin composition of the present invention obtained as described above has both of the function of supporting the wafer during back-grinding and the function of underfilling during chip packaging after dicing. Therefore, there can be exhibited excellent effects by the use of the sheet resin composition that water does not penetrate during back-grinding, and that even in cases where a wafer comprising bumps is used, the local pressure differences on the ground surface incurred by the bumps are mitigated by the elasticity and the plastic deformation exhibited by the sheet resin composition, thereby giving a wafer of which ground surface is smooth. In addition, the chips obtained by dicing the wafer can be packaged directly on a substrate, without necessitating complicated steps as in conventional process, so that there is also exhibited an excellent effect that the steps can be remarkably simplified.

Next, the process for manufacturing a semiconductor device of in accordance with one embodiment of the present invention will be described.

The process for manufacturing a semiconductor device in accordance with this embodiment comprises adhering onto a silicon wafer the sheet resin composition to support the silicon wafer, subjecting the silicon wafer to back grinding, and underfilling an interface between a chip and a substrate with the sheet resin composition as an underfilling material.

Figure 2:
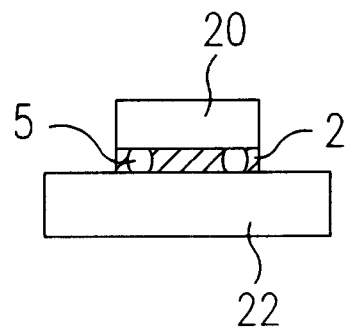
FIG. 2 is a schematic view showing a chip fixed to a substrate with a sheet resin composition thermally melted and cured to underfill the interface between the chip and the substrate in accordance with one embodiment of the present invention.

Concretely, when a sheet resin composition 2 (hereinafter also referred to as "resin composition sheet"), both sides of which are protected with the releasing plastic films, is used as shown in FIG. 1, the releasing plastic film is peeled off from one side of the resin composition sheet 2, and thereafter, an active surface of a silicon wafer 1 having bumps 5 thereon is directly adhered to the peeled-off side of the sheet resin composition 2, and the other side still protected with the releasing plastic film 3 is fixed on a grinding stage 4 of a grinding device, and the silicone wafer 1 is subjected to back-grinding. Subsequently, the silicon wafer 1 to which the resin composition sheet 2 is adhered is diced to form chips 20 to which the resin composition sheet 2 is still adhered. Thereafter the releasing plastic film 3 is peeled off, and the peeled-off surface of the sheet resin composition 2 is directly packaged to a substrate 22 as illustrated in FIG. 2. Therefore, electric connections are provided between the substrate 22 and the chip 20 by the bumps 5, and at the same time, the sheet resin composition 2 is thermally melted and cured to underfill the interface between the chip 20 and the substrate 22.

Incidentally, the dicing can be carried out from the side of the resin composition, or from the back side of the wafer. When the dicing is carried out from the back side of the wafer, the resin composition sheet also functions as a dicing sheet.

In addition, there can be carried out the following process in which the sequential order of dicing and back-grinding is reversed from the previously described process. Specifically, a process comprises adhering a dicing tape on a back side of a wafer; thereafter dicing a wafer having bumps to half-way of the thickness of the wafer (so-called half-cutting); pasting the sheet resin composition to an active surface of the wafer; peeling off the dicing tape on the back side of the wafer; subjecting the back side to back-grinding and cutting into chips; thereafter dicing the sheet resin composition from the back side of the wafer; picking up the chips with the sheet resin composition, sometimes called underfilling material, from a releasing plastic film; and packaging a peeled-off side of the sheet resin composition directly to a substrate, thereby obtaining an electric connection between the substrate and the chip, and at the same time thermally melting and curing the sheet resin composition to underfill the interface of the chip and the substrate.

A device to which this process is applied is not particularly limited. A mass-production process having an even more excellent stability is provided by using the sheet resin composition in accordance with one embodiment of the present invention in a device which is generally thin in thickness and easy cracked, such as GaAs device and applying the process in which the wafer is half-cut prior to subjecting the wafer to back-grinding.

The silicon wafer is not particularly limited. Its thickness is not particularly limited, and for instance, the thickness is suitably from about 200 to about 1000 μm. In addition, a bump 5 (FIG. 1) may or may not be formed on its surface. The height of the bump 5 is not particularly limited, and the height is generally from 10 to 200 μm.

The grinding device is not particularly limited, as long as it has a grinding stage, and a known device, such as "DFG-840" manufactured by DISCO K. K., is employed in one embodiment. In addition, the grinding conditions are also not particularly limited.

The thickness of the silicon wafer after back-grinding is generally from about 50 to about 600 μm. In addition, the process for dicing the resulting silicon wafer and the sizes of the chips obtained are not particularly limited.

When the chips with underfilling material obtained by dicing are packaged to a substrate, a usual flip chip bonder is used. The package conditions are not particularly limited, so long as excellent electric connection is obtained between the chips and the substrate, and the package conditions can be appropriately determined depending upon the electrode materials of the bumps or the substrate. The curing of the underfilling material or the melting of the bumps is carried out by using a flip chip bonder, or a curing furnace for underfilling material or a melting furnace for bumps is employed for its specialized use in accordance with various embodiments.

The semiconductor device obtained in the manner described above comprises a wafer of which ground surface is smooth, and has high reliability of the electric connection.

EXAMPLES

The present invention will be described in further detail by means of the working examples, without intending to limit the scope or spirit of the present invention thereto.

Example 1

All of the raw materials were mixed in proportions shown in Table 1 together with a solvent methyl ethyl ketone at ambient temperature. The resulting mixture was applied on a PTFE (polytetrafluoroethylene) film having a thickness of 100 μm by using a coating device (comma coater), and the coating was dried at 110° C. Thereafter, the coated film was rolled up in a roll-form, to give a resin composition sheet having a thickness of 80 μm, of which one side is protected by the PTFE film.

TABLE 1

| Composition in Example 1 | Amount (Parts by Weight) |
|---|---|
| Epoxy Resin | A (22) |
| Curing Agent | B (12) |
| Silica Powder | 60 |
| Acrylonitrile-Butadiene Rubber | 6 |
| Catalyst | DBU (0.2) |
| Coupling Agent | 0.3 |
| Methyl Ethyl Ketone | 24 |

In the table, "Epoxy Resin A" is a biphenyl epoxy resin having a structure represented by the formula (1):

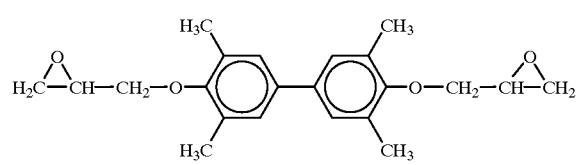

the epoxy resin A having an epoxy equivalence of 195 g/eq, and a melting point of 107° C. Curing Agent B is a phenolic novolak resin having a hydroxyl group equivalence of 105 g/eq, and a softening point of 60° C.

The inorganic filler used was molten silica, a spherical silica powder. The maximal particle size, the median size and the proportion of particles having a particle size of 5 μm or less for the molten silica were determined by scattering-type particle size distribution analyzer "LA-910" manufactured by HORIBA, Ltd. The results are shown in Table 2.

The catalyst DBU stands for 1,8-diazabicyclo(5.4.0)undecene-7.

In addition, acrylonitrile-butadiene rubber was used as a stress-lowering agent, and γ-glycidoxypropyl trimethoxysilane was used as a coupling agent.

A semiconductor device was manufactured with the resulting resin composition sheet with the manufacturing process in accordance with one embodiment of the present invention. Specifically, a side of the resin composition sheet was adhered to the side with bumps of a silicon wafer (diameter: 150 mm, thickness: 625 μm) having gold-plated bumps of 50 μm in height (peripheral: 200 bumps/chip, pitch: 180 μm). Thereafter, the other side of the resin composition sheet, the side protected by the PTFE film, was set on a grinding stage of a grinding device having the product name: "DFG-840," manufactured by DISCO, K. K., and the silicon wafer was subjected to back-grinding under given grinding conditions of rough grinding with No.360 at 4800 rpm to a thickness of 220 μm, and finish grinding with No.2000 at 6500 rpm to a thickness of 200 μm, to give a silicon wafer having a thickness of 200 μm. Subsequently, the silicon wafer with bumps to which the resin composition sheet was still attached was cut into chips having dimensions of 9.4 mm×9.4 mm by dicing. Thereafter, the PTFE film was peeled off from the resin composition sheet adhered to the resulting chips with bumps, and the peeled-off surface of the resin composition sheet was packaged on a substrate. The resin composition sheet was thermally melted and cured under the conditions of a stage temperature of 50° C., a tool temperature of 250° C., a bonding load of 98 N/chip, and a bonding time period of 30 seconds, and at the same time an electric connection was provided between the bumps and the substrate electrodes, thereby giving a semiconductor device.

Incidentally, the active surface of the silicon wafer with bumps after back-grinding was examined, and no water was found to penetrate to the surface of the wafer on which bumps exist. In addition, the ground surface of the silicon wafer was examined by using a surface roughness tester (surfcom), and the ground surface was found to be smooth.

In addition, as a substrate, a glass epoxy resin substrate having a thickness of 800 μm was used. The performance of the semiconductor device was examined. The results are shown in Table 2.

The evaluation methods are given below.
Amount of voids generated:
The amount of voids generated at the interface of the semiconductor element and the resin was observed by ultrasonic microscope. The area of the void-generated parts were calculated, and expressed as percentage to the chip area.

Electric Conductivity:

One cycle of the procedures for the semiconductor device was carried out by using a thermal shock device, the cycle comprising keeping the semiconductor device at −40° C. for 5 minutes, and thereafter keeping it at 125° C. for 5 minutes. The electric conductivity of the semiconductor device after carrying out 1000 cycles (electric conductivity after TST 1000 cycles), and that of the semiconductor device after carrying out 2000 cycles (electric conductivity after TST 2000 cycles) were measured, and expressed as the number of defective products per 10 semiconductor devices. The electric conductivity was evaluated by measuring an electric resistance by digital multimeter "TR6847," manufactured by Advantest, and counting the number of the semiconductor devices having electric resistances of 1.4 times or more than the initial electric resistance, which were recognized as defective products. In addition, the initial electric conductivity was evaluated by recognizing the semiconductor devices having infinitesimal electric resistances (disconnected) as "defect," and expressing as the number of defective products per 20 semiconductor devices.

Peeled-Off Chips and Electric Conductivity after PCT Test:

The semiconductor device was subjected to a pressure cooker test (PCT) under the conditions of keeping the device at 121° C., 100% RH, 2 atm for 168 hours. The tested semiconductor was examined on the presence or absence of the peeled-off chip. The proportion of the semiconductor devices of which chips were peeled off was expressed in percentage. Further, the electric conductivities were determined by using the semiconductor devices after the PCT, which was expressed by the number of the defective products per 10 semiconductor devices.

TABLE 2

|  | Example 1 | Example 2 | Example 3 |
|---|---|---|---|
| Silica Powder |  |  |  |
| Maximal Particle Size ($\mu$m) | 20 | 20 | 20 |
| Median Size ($\mu$m) | 2.8 | 2.8 | 2.8 |
| Proportion of Particles Having Particle Size of 5 $\mu$m or Less (% by Volume) | 71 | 71 | 71 |
| Amount of Voids Generated | 0.1% | 0.1% | 0.1% |
| Initial Electric Conductivity | 0/20 | 0/20 | 0/20 |
| Electric Conductivity after TST1000 Cycles | 0/10 | 0/10 | 0/10 |
| Electric Conductivity after TST2000 Cycles | 1/10 | 2/10 | 1/10 |
| Rate of Peeled-off Chips after PCT | 0% | 0% | 0% |
| Electric Conductivity after PCT | 0/10 | 0/10 | 0/10 |

It is clear from Table 2 that the semiconductor device obtained in accordance with the present invention is excellent in resistivities against the thermal shock test and the pressure cooker test.

Example 2

A semiconductor device was manufactured in accordance with the following process by using the resin composition sheet obtained in Example 1. Specifically, an adhesive tape for dicing, "ELEPHOLDER V12S," manufactured by Nitto Denko Corporation, was adhered to the surface of a silicon wafer (diameter: 150 mm, thickness: 625 $\mu$m) having gold-plated bumps of 50 $\mu$m in height (peripheral: 200 bumps/chip, pitch: 180 $\mu$m) on which no bumps exist, and the wafer was half-cut to a depth of 250 $\mu$m from the wafer surface in the dimensions of 9.4 mm×9.4 mm by using a cutting device having the product name: "DFG-651," manufactured by DISCO, K. K. Next, one side of the resin composition sheet was adhered onto a wafer surface with bumps. The adhesive tape for dicing was peeled off, and thereafter the other surface of the resin composition sheet, which was protected by a PTFE film, was set on a grinding stage of a grinding device having the product name: "DFG-840," manufactured by DISCO, K. K., and the silicon wafer was subjected to back-grinding under given grinding conditions of rough grinding with No.360 at 4800 rpm to a thickness of 220 $\mu$m, and finish grinding with No.2000 at 6500 rpm to a thickness of 200 $\mu$m. Subsequently, the wafer was cut by dicing from the side subjected to back-grinding, to give chips with a resin composition sheet having a thickness of 200 $\mu$m and dimensions of 9.4 mm×9.4 mm. Thereafter, the PTFE film was peeled off from the chips with the resin layer, and the peeled-off surface of the resin composition sheet was packaged on a substrate. The resin composition sheet was thermally melted and cured under the conditions of a stage temperature of 50° C., a tool temperature of 250° C., a bonding load of 98 N/chip, and a bonding time period of 30 seconds, and at the same time an electric connection was provided between the bumps and the substrate electrodes, thereby giving a semiconductor device.

Incidentally, the active surface of the silicon wafer with bumps after back-grinding was examined, and no water was found to penetrate to the surface of the wafer on which bumps exist. In addition, the ground surface of the silicon wafer was examined by using the surface roughness tester (surfcom), and the ground surface was found to be smooth. The substrate used and the evaluation methods for the semiconductor devices were the same as those in Example 1. The results are shown in Table 2.

Example 3

A semiconductor device was manufactured in the same manner in Example 1, except for using a silicon wafer (diameter: 200 mm, thickness: 625 $\mu$m) without bumps, and a glass epoxy resin substrate (thickness: 800 $\mu$m) having gold-plated bumps of 50 $\mu$m in height (peripheral: 200 bumps/chip, pitch: 180 $\mu$m). The performance of the semiconductor device was evaluated, and showed similar results to those of Example 1 as shown in Table 2.

The sheet resin composition in accordance with the present invention excellently supports a silicon wafer during back-grinding, and also has a function of underfilling when packaging a chip on a substrate. By using the sheet resin composition, the semiconductor device can be efficiently manufactured, because there are exhibited such effects that there is no penetration of water into an active surface during back-grinding, that the wafer is ground smoothly, and further that the chip packaging step is simplified.

The drawings and the forgoing description gave examples of the present invention. The scope of the present invention, however, is by no means limited by these specific examples. Numerous variations, whether explicitly given in the specification or not, such as differences in structure, dimension, and use of material, are possible. For example, although various ranges are set forth above for various materials, properties and characteristics, it is understood that these ranges are only illustrative and not limiting and that other ranges can be used depending upon the particular application. The scope of the invention is at least as broad as given by the following claims.

What is claimed is:

1. A sheet resin composition having a melt viscosity at 150° to 200° C. from 0.01 to 1000 Pa·s, a gelation time at 150° C. from 0.1 to 10 minutes, and a viscosity at a pasting temperature of from 20° to 150° C. from 10 to $10^{10}$ Pa·s consisting essentially of:
   a thermosetting resin composition;
   a curing agent of said thermosetting resin composition; and
   an inorganic filler, wherein said inorganic filler has a maximal particle size of 20 μm or less, a median particle size from 0.2 to 3 μm, and 70% by volume or more of particles having a particle size of 5 μm or less.

2. The sheet resin composition of claim 1 wherein said thermosetting resin composition is selected from the group consisting of an epoxy resin composition, a phenolic resin composition, a diallylphthalate resin composition, and a benzocyclobutene resin composition.

3. The sheet resin composition of claim 2 wherein said epoxy resin composition is selected from the group consisting of a cresol novolak epoxy resin, a biphenyl epoxy resin, a bisphenol A epoxy resin, and a bisphenol F epoxy resin.

4. The sheet resin composition of claim 1 wherein said thermosetting resin composition comprises an epoxy resin of the formula:

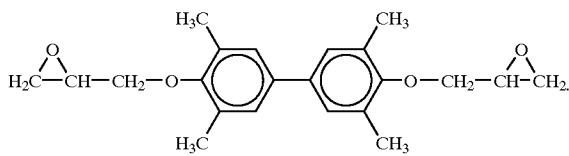

5. The sheet resin composition of claim 1 wherein said thermosetting resin composition comprises an epoxy resin of the formula:

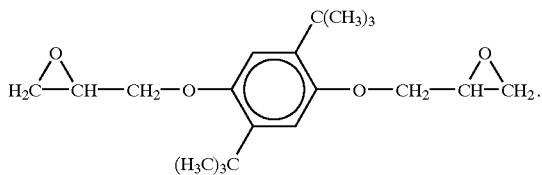

6. The sheet resin composition of claim 1 wherein said thermosetting resin composition comprises an epoxy resin of the formula:

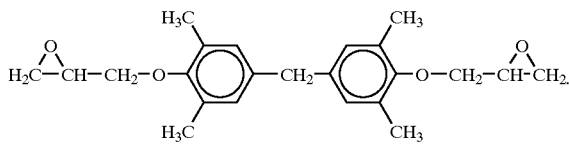

7. The sheet resin composition of claim 1 wherein said thermosetting resin composition comprises an epoxy resin having an epoxy equivalence of from 150 to 230 g/eq, and a melting point of from 50° to 160° C.

8. The sheet resin composition of claim 1 wherein said thermosetting resin composition comprises an epoxy resin, and an amount of said curing agent being sufficient to cure said epoxy resin.

9. The sheet resin composition of claim 1 wherein said curing agent is selected from the group consisting of a phenolic resin and an acid anhydride.

10. The sheet resin composition of claim 9 wherein said phenolic resin is selected from the group consisting of a phenol aralkyl resin and a phenol novolak resin.

11. The sheet resin composition of claim 1 wherein said curing agent has a hydroxyl group equivalence of from 80 to 200 g/eq and a softening point of 85° C. or less.

12. The sheet resin composition of claim 1 wherein said inorganic filler is selected from the group consisting of silica powder, alumina, silicon nitride, manganese oxide, calcium carbonate, and titanium white.

13. The sheet resin composition of claim 1 wherein a content of said inorganic filler in said sheet resin composition is up to 90% by weight of said sheet resin composition.

14. The sheet resin composition of claim 1 further comprising an additive.

15. The sheet resin composition of claim 14 wherein said additive is selected from the group consisting of a silicone compound, a stress-lowering agent, a wax, and a coupling agent.

16. The sheet resin composition of claim 1 further comprising a stress-lowering agent for suppressing a flowability of said sheet resin composition and for providing said sheet resin composition with tacking ability.

17. The sheet resin composition of claim 16 wherein said stress-lowering agent consists of copolymers selected from the group consisting of acrylonitrile-butadiene copolymer (NBR), hydrogenated acrylonitrile-butadiene rubber, acrylic acid, acrylic ester, styrene, and methacrylic acid.

18. The sheet resin composition of claim 1 further comprising a flame retardant.

19. The sheet resin composition of claim 18 wherein said flame retardant comprises a halogen-based flame retardant.

20. The sheet resin composition of claim 19 wherein said halogen-based flame retardant comprises a novolak brominated epoxy resin.

21. The sheet resin composition of claim 18 further comprising a flame retardant aid.

22. The sheet resin composition of claim 1 further comprising a catalyst.

23. The sheet resin composition of claim 22 wherein said catalyst consists essentially of a curing accelerator.

24. The sheet resin composition of claim 23 wherein said curing accelerator is selected from the group consisting of triphenylphosphine, 2-methylimidazole, DBU (1,8-diazabicyclo(5.4.0)undecene-7), DBN (1,5-diazabicyclo(4.3.0)nonene-5), and 4P4B (tetraphenylphosphonium tetraphenyl borate).

25. The sheet resin composition of claim 1 further comprising a solvent.

26. The sheet resin composition of claim 1 having a thickness from 5 to 250 μm.

27. A sheet resin composition having a melt viscosity at 150° to 200° C. from 0.01 to 1000 Pa·s, a gelation time at 150° C. from 0.1 to 10 minutes, and a viscosity at a pasting temperature of from 20° to 150° C. from 10 to $10^{10}$ Pa·s consisting essentially of:
   a thermosetting resin composition;
   a curing agent of said thermosetting resin composition;
   an inorganic filler; and
   a stress-lowering agent for suppressing a flowability of said sheet resin composition and for providing said sheet resin composition with tacking ability, wherein said stress-lowering agent consists of acrylonitrile-butadiene copolymer (NBR).

28. The sheet resin composition of claim 27 wherein a content of acrylonitrile in said acrylonitrile-butadiene copolymer (NBR) is from 10 to 50% by weight.

29. A sheet resin composition having a melt viscosity at 150° to 200° C. from 0.01 to 1000 Pa·s, a gelation time at 150° C. from 0.1 to 10 minutes, and a viscosity at a pasting temperature of from 20° to 150° C. from 10 to $10^{10}$ Pa·s consisting essentially of:

a thermosetting resin composition;

a curing agent of said thermosetting resin composition;

an inorganic filler; and a flame retardant, wherein said flame retardant consists essentially of a composite metal hydroxide having a crystalline structure of a polyhedral shape.

30. The sheet resin composition of claim 29 wherein said composite metal hydroxide is of the formula:

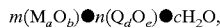

$m(M_aO_b) \bullet n(Q_dO_e) \bullet cH_2O$, wherein M and Q are metal elements different from each other, wherein M is selected from a group consisting of Al, Mg, Ca, Ni, Co, Sn, Zn, Cu, Fe, Ti and B, wherein Q is a metal element belonging to a Group selected from Groups IVa, Va, VIa, VIIa, VIII, Ib and IIb in the Periodic Table, and wherein each of m, n, a, b, c, d and e is a positive number, which may be identical to or different from each other.

31. The sheet resin composition of claim 30 wherein Q is selected from the group consisting of Fe, Co, Ni, Pd, Cu, Zn, and admixtures thereof.

32. The sheet resin composition of claim 29 wherein said polyhedral form is selected from the group consisting of an approximate dodecahedron, an approximate octahedron, and an approximate tetrahedron.

33. The sheet resin composition of claim 29 wherein said crystalline structure of said composite metal hydroxide has an aspect ratio of from 1 to 8, wherein said aspect ratio is expressed by a ratio of length to width of said crystalline structure of said composite metal hydroxide.

34. A sheet resin composition having a melt viscosity at 150° to 200° C. from 0.01 to 1000 Pa·s, a gelation time at 150° C. from 0.1 to 10 minutes, and a viscosity at a pasting temperature of from 20° to 150° C. from 10 to $10^{10}$ Pa·s consisting essentially of:

a thermosetting resin composition;

a curing agent of said thermosetting resin composition;

an inorganic filler; and a solvent, wherein said solvent is selected from the group consisting of methyl ethyl ketone, acetone, ethyl acetate, and toluene.

* * * * *